United States Patent [19]
Morimoto

[11] Patent Number: 6,165,810
[45] Date of Patent: Dec. 26, 2000

[54] METHOD OF MANUFACTURING SEMICONDUCTOR DEVICE AND DISPLAY DEVICE

[75] Inventor: Yoshihiro Morimoto, Inazawa, Japan

[73] Assignee: Sanyo Electric Co., Ltd., Osaka, Japan

[21] Appl. No.: 09/169,832

[22] Filed: Oct. 12, 1998

[30] Foreign Application Priority Data

Oct. 13, 1997 [JP] Japan ..................................... 9-279025

[51] Int. Cl.[7] .................................................. H01L 21/00
[52] U.S. Cl. ........................... 438/30; 438/151; 438/152; 438/166
[58] Field of Search ............................. 438/30, 151, 152, 438/166, 172

[56] References Cited

U.S. PATENT DOCUMENTS

| 5,413,958 | 5/1995 | Imahashi et al. ........................ 437/173 |
|---|---|---|
| 5,415,691 | 5/1995 | Fujiyama et al. ......................... 118/52 |
| 5,661,114 | 8/1997 | Otto et al. ................................ 505/501 |
| 5,695,557 | 12/1997 | Yamagata et al. ........................ 117/97 |
| 5,716,207 | 2/1998 | Mishina et al. ......................... 432/253 |
| 5,721,601 | 2/1998 | Yamaji et al. ........................... 349/138 |
| 5,771,110 | 6/1998 | Hirano et al. ............................. 257/72 |
| 5,994,275 | 11/1999 | Otto et al. ................................ 505/121 |

*Primary Examiner*—Richard Elms
*Assistant Examiner*—Michael S. Lebentritt
*Attorney, Agent, or Firm*—Cantor Colburn LLP

[57] ABSTRACT

A semiconductor device manufacturing method is provided for manufacturing semiconductor elements on a substrate through RTA (Rapid Thermal Annealing) using a lamp. A substrate is sequentially and preliminarily heated using a plurality of preliminary heating plates arranged for stepwise temperature rise before annealing the substrate using the RTA technique. After the heating process, a cooling step may be performed to the substrate to cool it stepwise. The annealing process can prevent a breakage in a substrate due to thermal stress, while the throughput increases.

28 Claims, 10 Drawing Sheets

BACK EXPOSURE

METHOD OF MANUFACTURING SEMICONDUCTOR DEVICE AND DISPLAY DEVICE

BACKGROUND OF THE INVENTION

1. Field of the Invention

The present invention relates to a method of manufacturing a semiconductor device in which semiconductor elements are formed on a substrate. The present invention also relates to a method of manufacturing a display device such as a liquid-crystal panel including switching elements for driving pixels.

2. Description of the Related Art

Recently, thin film transistors (hereinafter referred to as TFTs) using polycrystalline Silicon films (referred to as p-Si films) acting as active layers formed on a transparent insulating substrate have been employed as pixel drive elements in an active matrix LCD (Liquid Crystal Display).

The poly silicon thin film transistor (referred to as a p-Si TFT) advantageously has a larger mobility and higher drive capability, as compared with the a-Si thin film transistor in which an amorphous silicon film is used as an active layer. Hence, the use of p-Si TFTs allows a high-performance LCD to be realized and peripheral drive circuits to be integrated on the same substrate in addition to the pixel area.

In the p-Si TFT, the source region and the drain region are formed in a p-Si film acting as an active layer by implanting ions into both p-Si films and then annealing them for activation.

FIG. 1 is a cross sectional view illustrating a transistor element which is subjected to a conventional activating step after ion implantation to source region and drain regions.

The following steps are performed prior to the step shown in FIG. 1. First, a gate electrode 2 of a high-melting point metal (refractory metal) is formed on an insulating substrate 1. Insulating thin films 3 and 4, and an a-Si film are subsequently formed on the gate electrode 2. The p-Si film 6 is formed by melting and recrystallizing the a-Si film with a laser beam. Next, a $SiO_2$ film is formed on the entire surface of the p-Si film 6, so that a stopper 7 is formed by using the photolithographic technique and the dry-etching technique. The p-Si film 6 is subjected to an ion doping, with the stopper 7 used as a mask. Thus, the source region 6s and the drain region 6d are formed in the p-Si film 6.

Thereafter, a heating process is performed to activate doped ions, as shown in FIG. 1. Known heating methods include RTA (Rapid Thermal Annealing), furnace annealing, and the like. RTA methods include lamp RTA methods using a lamp and ELA (Excimer Laser Annealing) methods using an excimer laser.

ELA uses a laser beam with a relatively small beam size of 0.5 mm×150 mm, thus providing small throughput. The laser beam has short oscillation wavelengths and tends to be easily absorbed by the gate electrode material. Furthermore the laser beam outputted from excimer laser source has a relatively short oscillation pulse width of 10 to 30 ns. Hence, ELM methods cannot sufficiently activate impurities because the film temperature rise time is very short. For sufficient activation, the p-Si film needs to increase its annealing temperature so that ELA tends to be easily affected by the material, size, and pattern density of the gate electrode.

Particularly, with a top-gate structure, the gate electrode may be melted during the activation annealing process or may be ablated. RTA uses a xenon arc lamp which radiates light of relatively broad oscillation wavelengths and a large beam size of 10 mm wide×400 mm long. Hence, unlike ELA, a light absorption efficiency according to materials is small difference, and it is not needed to rising the temperature of the p-Si film because an irradiation time is relatively long. This method can provide high throughput and is not affected by the influence of the gate electrode structure.

However, since the activation of a semiconductor layer through RTA requires large irradiation beam size and long irradiation time, the glass substrate on which a semiconductor layer is formed, increases to a very high temperature. Hence, there is a disadvantage in that, since the substrate temperature at a light irradiated portion rises with a larger lamp output, the difference in temperature between the light irradiated portion and non-irradiated portions becomes too large, and the resulting thermal strain often causes a substrate to crack.

SUMMARY OF THE PRESENT INVENTION

The present invention is made to solve the above-mentioned problems.

Moreover, the objective of the invention is to provide a semiconductor device manufacturing method which can prevent a fracture in a substrate due to thermal stress, while the throughput increases.

Another objective of the invention is to provide a display manufacturing method which can prevent fracture in a substrate due to thermal stress, while the throughput increases.

According to the present invention, a semiconductor device manufacturing method for manufacturing semiconductor elements on a substrate through a RTA (Rapid Thermal Annealing) technique using a lamp, comprises the steps of sequentially and preliminarily heating the substrate with plural preliminary heating plates arranged for stepwise temperature rise; and then annealing the substrate using the RTA technique.

In another aspect of the present invention, the semiconductor device manufacturing method further comprises the step of sequentially cooling the substrate with plural cooling plates arranged so as to perform stepwise temperature decrease after the substrate is annealed through the RTA technique.

In a semiconductor device manufacturing method according to another aspect of the present invention, the step of annealing the substrate with the RTA technique comprises a step of activating impurities doped into a semiconductor film being a part of the semiconductor element.

In another further aspect of the present invention, the semiconductor device manufacturing method further comprises a step of forming a metal layer on or underneath the semiconductor film before the thermal annealing step; and the step for annealing the substrate through the RTA technique comprises a step of activating impurities doped into a semiconductor film being a part of the semiconductor element.

In the semiconductor device manufacturing method in another aspect of the present invention, the substrate is a glass substrate.

According to another aspect of the present invention, a display device manufacturing method for manufacturing switching elements on a substrate through a RTA (Rapid Thermal Annealing) technique using a lamp, the switching elements driving pixels e.g. liquid crystal pixels, comprises the steps of sequentially and preliminarily heating the substrate with plural preliminary heating plates arranged for stepwise temperature rise; and then annealing the substrate using the RTA technique.

In yet another aspect of the present invention, the display device manufacturing method further comprises a step of sequentially cooling the substrate with plural cooling plates arranged so as to perform stepwise temperature decrease after the substrate is annealed through the RTA technique.

As described above, the substrate is preliminarily heated with plural preliminary heating plate arranged for stepwise temperature rise before the substrate is subjected to a heating process. Hence, it can be suppressed that the thermal strain due to a sharp temperature rise in the RTA step occurs crack of the semiconductor, while the throughput can increase.

As described above, even when a glass substrate is used as a substrate, the substrate can be prevented from being cracked due to thermal strain by performing a slow, stepped cooling process after the annealing process.

BRIEF DESCRIPTION OF THE DRAWINGS

This and other objects, features and advantages of the present invention will become more apparent upon a reading of the following detailed description and drawings, in which.

DESCRIPTION OF THE PREFERRED EMBODIMENTS

First Embodiment

Figure 1:
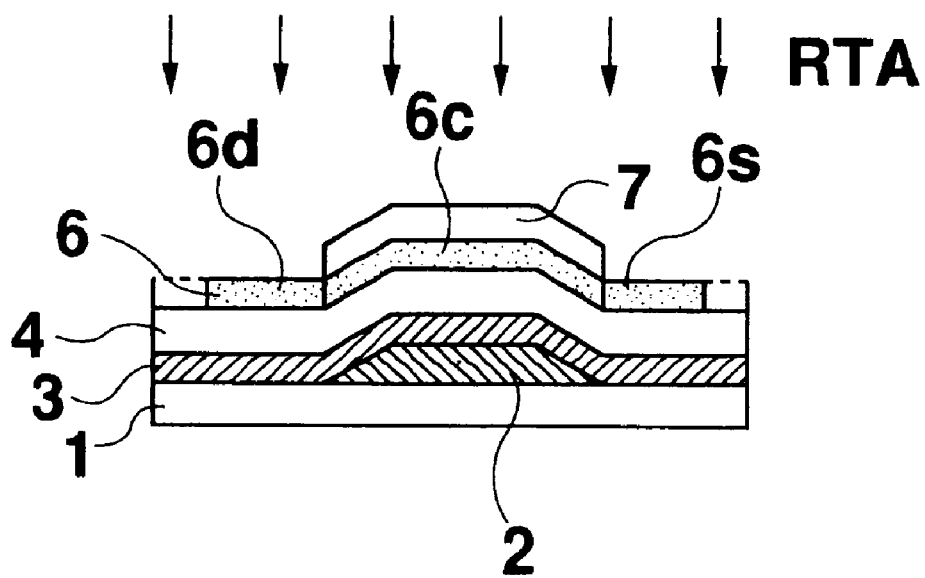
FIG. 1 is a cross sectional view illustrating the structure of a semiconductor element in a stage of a conventional semiconductor device manufacturing method.

The semiconductor device manufacturing method according to preferred embodiments of the present invention will be described below with reference to the attached drawings. Moreover, the liquid crystal display manufacturing method according to preferred embodiments of the present invention will be described below with reference to the attached drawings.

FIGS. 2A to 2H are cross sectional views each illustrating steps of the semiconductor device manufacturing method according to the first embodiment of the present invention.

In step 1 (FIG. 2A):

A metal film 2 of a thickness of 1500 Å of a high melting point metal (refractory metal) such as chromium (Cr) or molybdenum (Mo) is formed on an insulating substrate 1 such as silica glass or non-alkali glass using the sputtering technique. Then, the metal film 2 is processed in a predetermined pattern using the photolithographic technique and the dry etching technique according to the RIE (Reactive Ion Etching) method to form the gate electrode 2.

In step 2 (FIG. 2B):

Using the normal pressure CVD method and the reduced pressure CVD method, a $SiO_2$ film 3 and a SiN film 4 are subsequently deposited as an insulating thin film on the gate electrode 2 at a forming temperature of 350° C. The film thickness of the $SiO_2$ is 1300 Å while the thickness of the SiN film is 500 Å. An a-Si film 5 of 400 Å is formed on the insulating thin film by using pyrolytically decomposing monosilane under equal to or less than 550° C. in the low pressure CVD method.

In step 3 (FIG. 2C):

An annealing process is performed by scanning and irradiating a KrF excimer laser beam onto the surface of the a-Si film 5. Thus, a p-Si film 6 is formed by melting and recrystallizing the a-Si film 5.

The laser irradiation in step 3 is performed under conditions where an annealing atmosphere is equal to or less than $1 \times 10^{-4}$ Pa, and that a substrate temperature ranges from a room temperature to 600° C., and that an irradiation energy density is 100 to 500 $mJ/cm^2$, and that a scanning rate is 1 to 10 mm/sec (in actual, the scanning rate can be set at value ranging 0.1 mm to 100 mm/sec can be set).

A XeCl excimer laser with a wavelength $\lambda$ of 308 nm or ArF excimer laser with a wavelength $\lambda$ of 193 nm may be used as the laser beam.

In this case, the laser irradiation is performed on condition that an annealing atmosphere is equal to or less than $1 \times 10^{-4}$ Pa; a substrate temperature ranges from a room temperature to 600° C.; an irradiation energy density is 100 to 500 $mJ/cm^2$; and a scanning rate is 1 to 10 mm/sec (the scanning rate may be set at a value ranging 0.1 mm to 100 mm/sec).

Even when either laser beam mentioned above is used, the grain size of p-Si increases in proportion to the irradiation energy density and irradiation times. Hence, it is preferable to control the energy density to obtain a desired grain size.

In this embodiment, a high-throughput laser irradiation method is used for the excimer laser annealing process.

Figure 4:
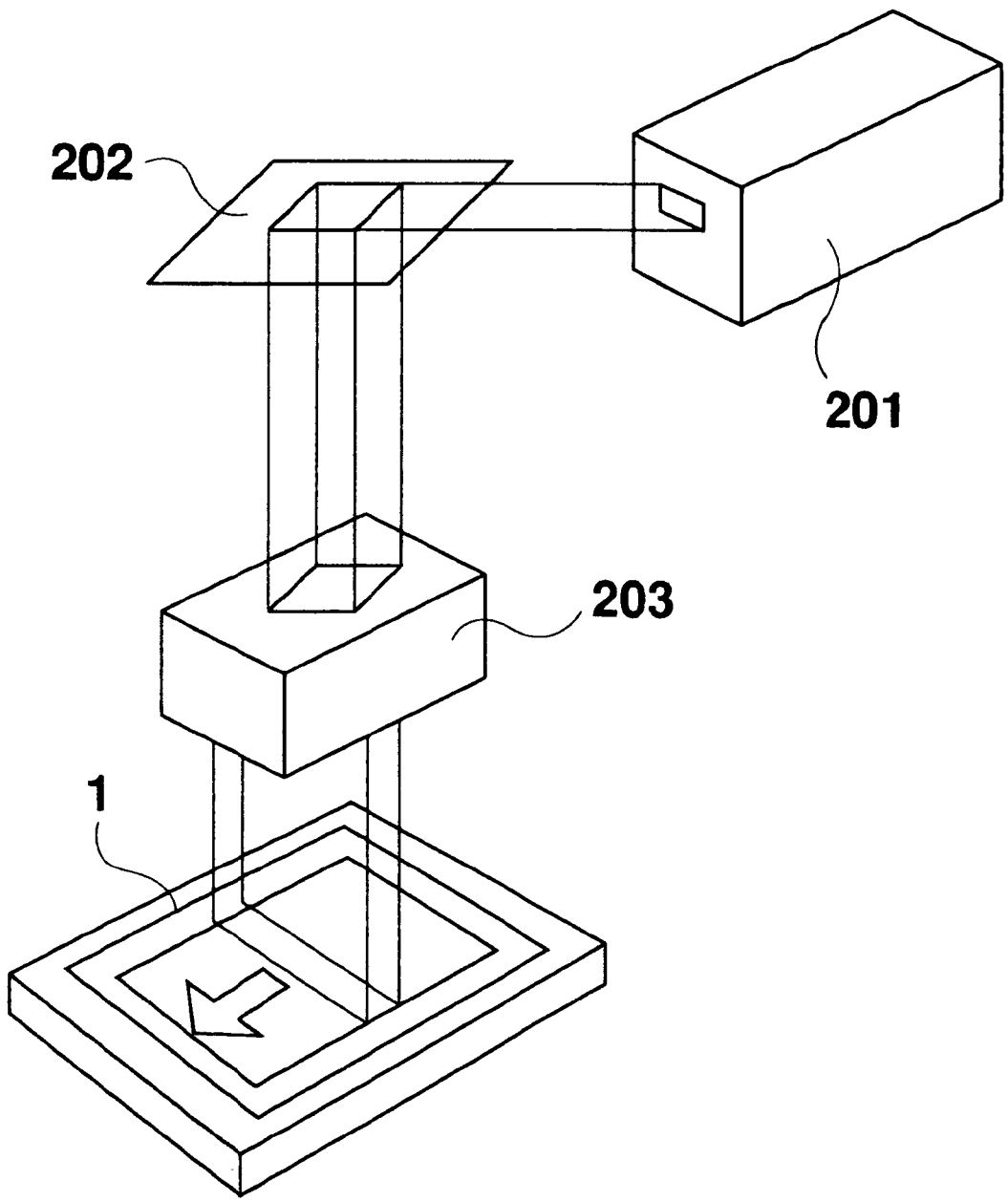
FIG. 4 is a perspective view illustrating a laser irradiating device used for the semiconductor device manufacturing method according to the present invention.

FIG. 4 shows the laser beam irradiation device mentioned above.

In FIG. 4, numeral 201 represents a KrF excimer laser source; 202 represents a light reflector for reflecting laser beams emitted from the laser source 201; and 203 represents a laser beam control optical system for processing a laser beam from the reflector 201 in a predetermined shape and irradiating it onto a substrate 1.

In such a structure, the high-throughput laser irradiation method is a method of irradiating a sheet (150 mm×0.5 mm) laser beam in an overlapped mode by means of the laser beam control optical system 203. The throughput can be improved by completely synchronizing the stage scanning rate of the stage mounting the substrate 1 with the pulse laser irradiation and then irradiating the laser onto the substrate in a very high accurate overlapped mode on the high-throughput laser irradiation method.

In step 4 (FIG. 2D):

After a $SiO_2$ film 7 is deposited on the entire surface of the p-Si film 6 using the CVD method, a photoresist film 8 is formed on the entire surface of the $SiO_2$ film 7. Thereafter, the photoresist film 8 is exposed from the side of the insulating substrate 1 (upward in FIG. 2D) through the so-called self-alignment back exposure process. Thus, only the photoresist film 8 light-shielded by the gate electrode 2 remains.

In step 5 (FIG. 2E):

The $SiO_2$ film 7, not covered with the photoresist film 8, is selectively removed using the dry etching technique according to the RIE method to form the stopper 9 made of $SiO_2$. The stopper 9 acts as an ion blocking mask in the ion doping step at the step for forming the LDD structure.

P-type or N-type ions are doped into the p-Si film 6, with the stopper 9 acting as a mask.

That is, P-type or N-type ions are doped into the p-Si film 6 not covered with the stopper 9 according to the type of TFT transistor to be formed.

P-type ions such as boron (B) are implanted as impurities to form a P-channel TFT transistor while N-type ions such as phosphorus (P) are doped as impurities to form a N-channel TFT transistor.

Thus the region of the p-Si film 6 acting as an active layer covered with the stopper 9 becomes a channel region 6c. Regions on both sides of the channel region 6c become a source region 6s and a drain region 6d, respectively.

In step 6 (FIG. 2F):

The p-Si film 6 where the source region 6s and the drain region 6d are formed are subjected to the rapid annealing process according to the RTA method using a lamp.

The impurity ions doped in the source region 6s and the drain region 6d are activated through the annealing process. Then the p-Si film 6 is selectively removed in an island pattern so as to remain regions of a predetermined length on both sides of the stopper 7 and the gate electrode 2, so that TFT transistors are independently separated from each other. At this time, the p-Si film 6 and the $SiO_2$ film 10 at the peripheral regions of the substrate are removed at the same time.

Figure 5:
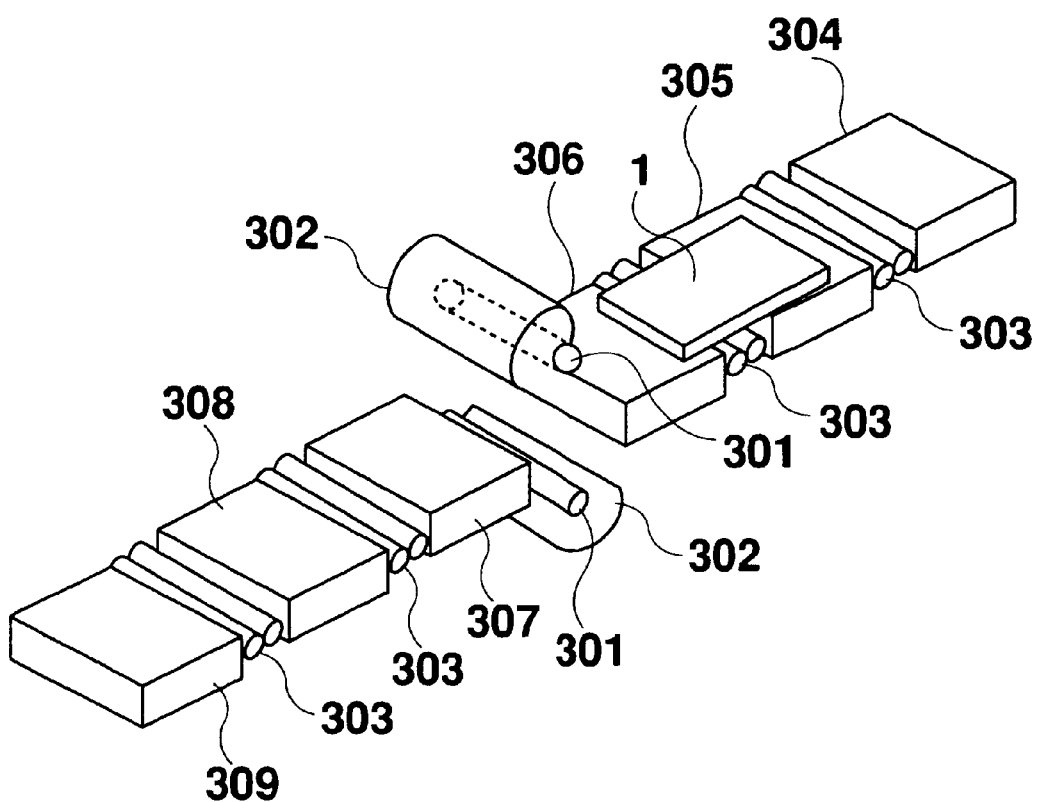
FIG. 5 is a schematic diagram illustrating a rapid thermal annealing apparatus used in the manufacturing method of the present invention.

Next, the RTA method employing a lamp will be explained. FIG. 5 shows a rapid annealing device according to the RTA method using a lamp, according to the present invention.

As shown in FIG. 5, the sheet-like beam source consists of a Xenon (Xe) arc lamp 301 and a light reflector 302 disposed so as to cover the lamp 301. Two sets of beams sources are vertically disposed so as to confront to each other.

The substrate 1 is conveyed from the right to the left (in FIG. 5) at a conveying rate of 15 mm/sec by means of the roller 303. For the purpose of a preliminarily heating procedure, the substrate 1 is sequentially conveyed to the first, second and third. preliminary heating plates 304, 305 and 306. To avoid cracking the substrate 1 due to thermal strain, the plate temperatures of the preliminary heating plates 304, 305 and 306 are set in order of increasing temperature. Each preliminary heating plate is set to a temperature at which the substrate 1 will not strain and crack. Specifically, according in the present description, the first preliminary heating plate 304 is set to 400° C.; the second preliminary heating plate 305 is set to 480° C.; and the third preliminary heating plate 306 is set to 580° C.

After the substrate 1 has passed through the third preliminary heating plate 306, it is subjected to a rapid annealing process using the Xenon arc lamp (10 mm wide×400 mm long).

In the RTA method, heating is performed wherein a Xe arc lamp is used as the light source, the atmosphere is $N_2$, heating time ranges 0.5 to 1 sec, and wherein the heating temperature is 650° C.

The substrate 1 is further conveyed rightward (in FIG. 5) after the RTA process. Then, in order to prevent the substrate from being cracked due to rapid cooling after the rapid heating operation, the temperature of the substrate 1 is first dropped to 580° C. on the preliminary heating plate 307 and then is naturally cooled.

As described above, likewise the process prior to the RTA process, the substrate subjected to the RTA process may be cooled by sequentially conveying toward plural cooling plates 307, 308 and 309 arranged in an stepwise temperature decreasing order by means of the conveying roller 303. In concrete, the first cooling plate 307 may be set to 580° C. immediately after the RTA process. Next, the second cooling plate 308 may be set to 480° C. Then. the third cooling plate 309 may set to 400° C.

In step 7 (FIG. 2G):

A $SiO_2$ film 10 and a silicon nitride (SiN) film 11 are stacked on the p-Si film 6 using a CVD method to form an interlayered insulating film 12 being a two-layered structure of the $SiO_2$ film 10 and the SiN film 11. The thickness of the $SiO_2$ film 10 is 500 Å. Thickness of the SiN film 11 is 3000 Å. After formation of the $SiO_2$ film 10 and the SiN film 11, the intermediate structure is heated at 400° C. in a nitrogen atmosphere for one hour. As result, hydrogen ions contained in the SiN film 11 are introduced into the p-Si film 6, so that the crystalline defects within the p-Si film 6 are filled with the hydrogen ions (hydrogen atoms).

In step 8 (FIG. 2H):

First contact holes 13 are respectively formed at the positions corresponding to the source region 6s and the drain regions 6d so as to reach the p-Si film 6 through the interlayered insulating film 12. A source electrode 14s and a drain electrode 14d, both composed of a metal such as aluminum, are respectively formed in the first contact holes 13. For example, the source electrode 14s and the drain electrode 14d are formed by patterning an aluminum film sputtered on the SiN film 11 in which the first contact holes are formed.

Thus, p-Si TFT elements acting as semiconductor elements are formed.

Figure 2A:
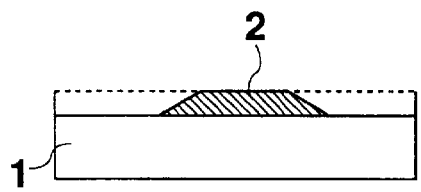
FIGS. 2A, 2B, 2C, 2D, 2E, 2F, 2G, and 2H are cross-sectional views each illustrating a semiconductor element formed through a semiconductor device manufacturing method according to a first embodiment of the present invention.
Figure 2B:
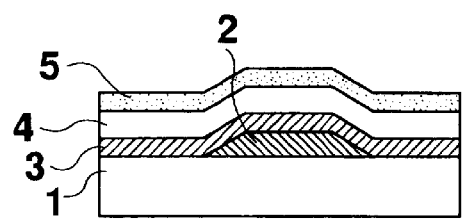
Figure 2C:
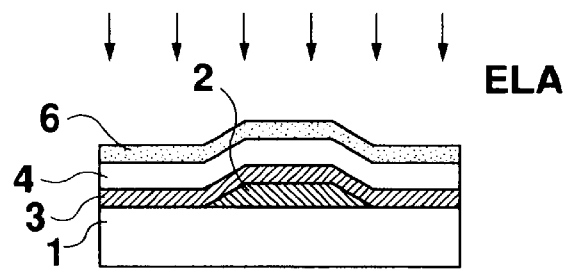
Figure 2D:
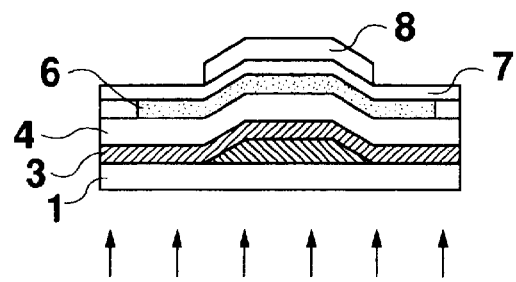
Figure 2E:
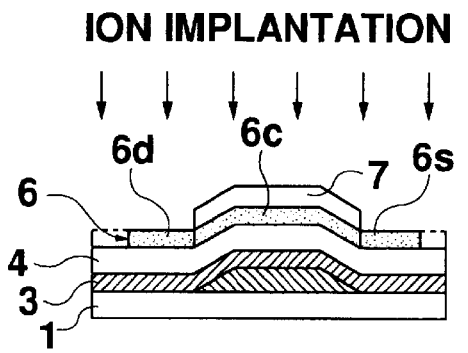
Figure 2F:
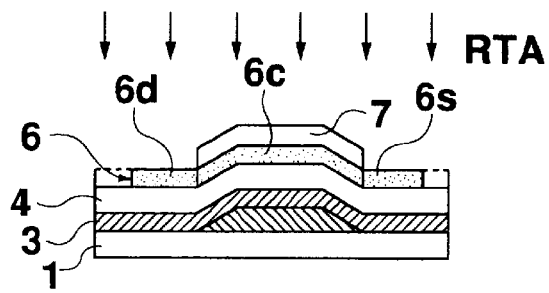
Figure 2G:
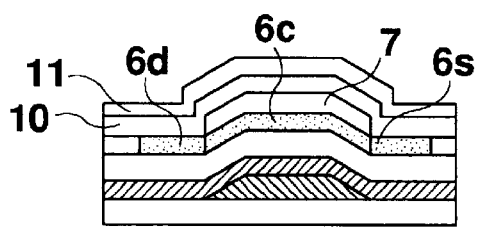
Figure 2H:
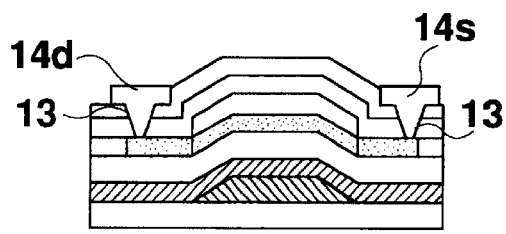
Figure 2I:
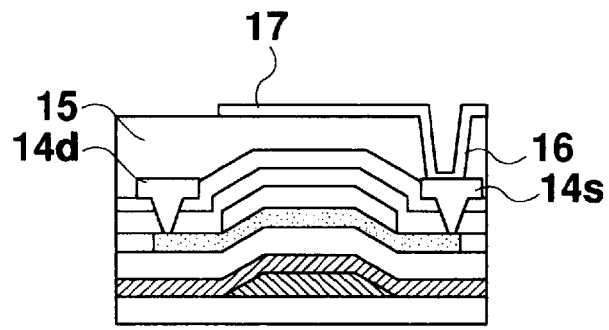
FIGS. 2I and 2J are cross sectional views each illustrating a semiconductor element used in a liquid crystal display according to the first embodiment of the present invention.
Figure 2J:
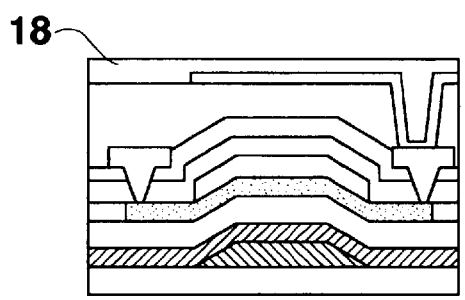

A liquid-crystal display using p-Si TFTs will be described below. FIGS. 2I and 2J are manufacture flow diagrams explaining a liquid-crystal display manufacturing method. After the manufucuturing of the p-Si TFT in step 8 (FIG. 2H), a liquid-crystal display is manufactured by further adding the following steps.

In step 9 (FIG. 2I):

To flatten the entire surface of the device, a planar film 15 is formed on the interlayered insulating layer 12 and the electrodes in which the source electrode 14s and the drain electrode 14d are formed. The planar film 15 is an acrylic resin layer 26 formed by coating and baking an acrylic resin solution. The acrylic resin layer is formed over uneven surfaces introduced by the stopper 9, the source electrode 14s and the drain electrode 14d to obtain a planer top surface.

Furthermore, second contact holes 16 penetrating the acrylic resin layer being the planar film 15 are formed on the source electrode 14s. A pixel electrode 17 extends over the acrylic resin layer and is connected to the source electrode 14s through the second contact hole 16. The pixel electrode 17 is formed by depositing a transparent conductive film, for example, ITO (Indium Thin Oxide) over the planar film 15 in which the second contact hole 16 is formed; coating a resist film on the transparent conductive film; forming the resist film in a predetermined electrode pattern; and etching an exposed transparent conductive film using a dry etching method, for example, RIE method, where HBr gas and $Cl_2$ are used as an etching gas.

In step 10 (FIG. 2J):

An alignment layer 18 of polyimide or $SiO_2$ for aligning the liquid crystal is formed over the pixel electrode 17 and the planer film 15 using the printing method or spinning method.

Thus, one TFT substrate used for a liquid crystal display using liquid crystal driving TFTs acting as switching elements is completed.

Figure 3:
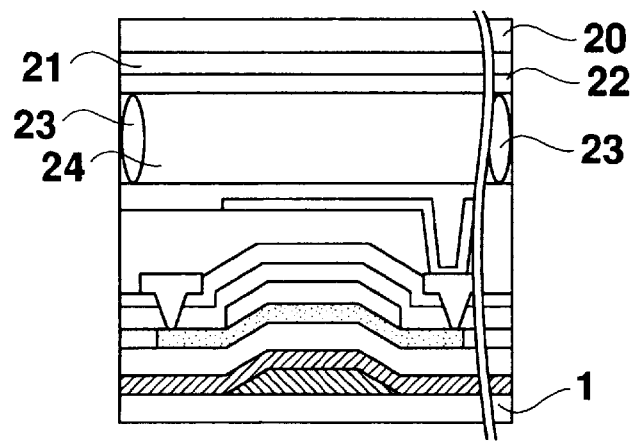
FIG. 3 is a cross sectional view illustrating a liquid crystal display according to the first embodiment of the present invention.

FIG. 3 is a cross sectional viewpartly illustrating a liquid crystal display where the above-mentioned TFT substrate is used. As shown in FIG. 3, an opposite electrode 21 of a transparent conductive film such as ITO is formed on the entire surface of an insulating substrate 20 of silica glass or non-alkali glass. In succession, an alignment layer 22 such as polyimide or $SiO_2$ is formed on the opposite electrode 21, so that an opposite electrode substrate is constructed.

The opposite electrode substrate 20 is disposed so as to opposite the TFT substrate 1. The TFT substrate and the opposite electrode substrate are bonded together, with the adhesive resin seal agent 23 coated the peripheral regions of them. Then, the gap between the two substrates are filled with the liquid crystal 24, so that a liquid crystal panel is completed.

Second Embodiment

An illustrative example wherein both a semiconductor device manufacturing method and a liquid crystal panel manufacturing method according to the present invention are embodied in manufacturing of the top gate type semiconductor device will be described below.

FIGS. 6A to 6F are flow diagrams each illustrating a semiconductor device manufacturing method according to the embodiment of the present invention. First, the semiconductor device manufacturing method will be described.

Figure 6A:
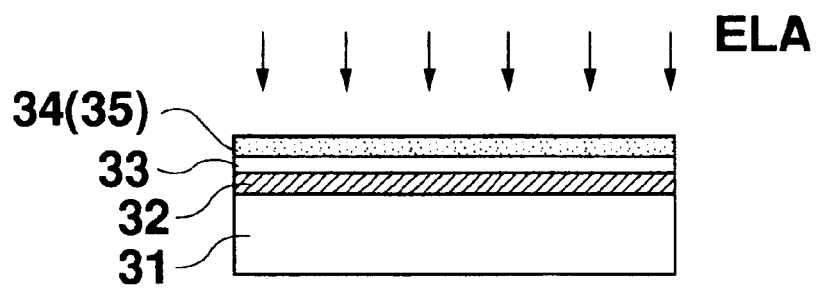
FIGS. 6A, 6B, 6C, 6D, 6E and 6F are cross sectional views each illustrating a semiconductor element formed through a semiconductor device manufacturing method according to a second embodiment of the present invention.
Figure 6B:
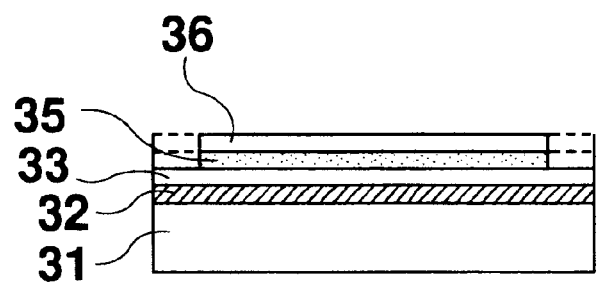

The step 1 (FIG. 6A)

A $SiO_2$ film 32 and a SiN film 33 are sequentially formed on the insulating substrate 31 of silica glass or non-alkali glass using the normal pressure CVD method or reduced pressure CVD method. At a film forming temperature of 350° C., the thickness of the $SiO_2$ film 32 is 1300 Å while the thickness of the SiN film 33 is 500 Å. A 400 Å-thick a-Si film 34 is deposited on the insulating thin film by decomposing monosilane at a temperature of equal to or less than 550° C. in the reduced CVD method.

An annealing process is performed by scanning and irradiating KrF excimer laser beam on the surface of the a-Si film 34. A p-Si film 35 is formed by melting and recrystallizing the a-Si film 34. The p-Si film 35 acts as an active layer of p-Si TFT.

The laser irradiating process is made on condition that an annealing atmosphere is equal to or less than $1\times10^{-4}$ Pa, that a substrate temperature ranges a room temperature to 600° C., that an irradiation energy density ranges 100 to 500 $mJ/cm^2$, and that a scanning rate ranges 1 to 10 mm/sec (in actuality, the scanning rate can be set to a value ranging 0.1 to 100 mm/sec).

A XeCl excimer laser of a wavelength λ of 308 nm or an ArF excimer laser of a wavelength λ of 193 nm may be used to produce the laser beam. In this case, the laser irradiation is performed when the annealing atmosphere is equal to or less than $1\times10^{-4}$ Pa, the substrate temperature ranges a room temperature to 600° C., the irradiation energy density ranges 100 to 500 $mJ/cm^2$, and the scanning rate ranges 1 to 10 mm/sec (in actual, the scanning rate can be set to ranging 0.1 to 100 mm/sec).

Whichever laser is used, the p-Si grain size becomes large in proportion to the irradiation energy density and irradiation times. Hence, a desired grain size can be obtained by adjusting the energy density.

In step 2 (FIG. 6B):

A gate insulating film 36 of $SiO_2$ is deposited on the entire surface of the p-Si film 35 by the CVD method. Then, the $SiO_2$ film and the p-Si film are processed in a predetermined pattern by using the photolithographic technique and the dry etching technique according to the RIE method.

Figure 6C:
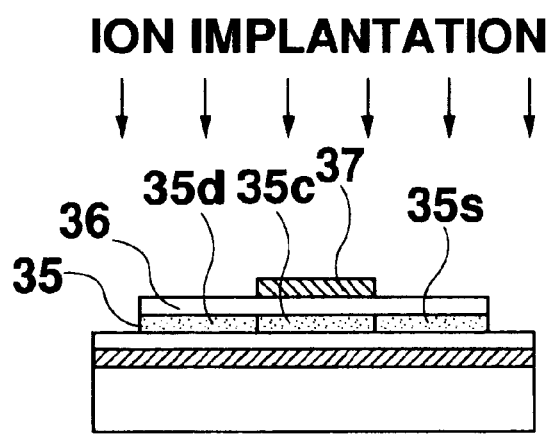
Figure 6D:
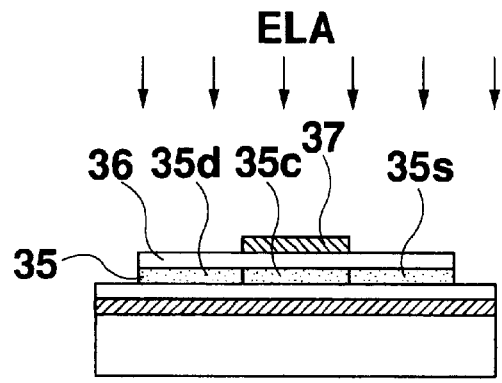

In step 3 (FIG. 6C)

A 1500 Å-thick metal film 37 of a high-melting point (refractory metal) metal such as chromium (Cr) or molybdenum (Mo) is formed on the gate insulating film 36 by sputtering. A gate electrode 37 is formed by processing the metal film 37 in a predetermined pattern using the photolithographic technique and the dry etching technique according to the RIE method.

While the gate electrode is formed, a gate signal line (not shown) connected to the gate electrode to supply a gate signal is formed. P-type or N-type ions are implanted into the p-Si film 35, with the gate electrode being used as a mask.

That is, P-type or N-type ions are doped into the p-Si film 35 not covered with the gate electrode 37 according to the type of TET to be formed.

P-type ions such as boron (B) are doped to form a P-channel TET while N-type ions such as phosphorus (P) are implanted to form an N-channel TFT. Thus, the p-Si film 17 underneath the gate electrode acts as a channel region 35c. Both sides of the gate electrode act as the source region 35c and the drain region 35d.

In step 5 (FIG. 6D):

The p-Si film 35 where the source region 35s and the drain region 35d are formed is subjected to a rapid lamp annealing process in the RTA method.

As shown in FIG. 5, a sheet-like beam source includes a xenon (Xe) arc lamp and a reflector disposed over the xenon arc lamp. Two sheet-like beam sources and reflectors are arranged so as to confront to each other.

The substrate is conveyed from right to left at a conveying rate of 15 mm/sec by means of the rollers. For the purpose of a preliminarily heating procedure, the substrate 1 is sequentially conveyed toward the first, second and third preliminary heating plates. To avoid the substrate being cracked due to the thermal strain during cooling, the plate temperatures of the preliminary heating plates are set in an order of increasing temperature. Specifically, the first preliminary heating plate may be set to 400° C.; the second preliminary heating plate may be set to 480° C.; and the third preliminary heating plate may be set to 580° C.

After the substrate has passed through the third preliminary heating plate, it is subjected to a rapid annealing process using the Xenon arc lamp (10 mm wide×400 mm long).

In the RTA method, heating is performed on condition that a Xe arc lamp is used as the light source; that an atmosphere is $N_2$; that a heating time ranges 0.5 to 1 sec; and that a heating temperature is 650° C.

The substrate 1 is further conveyed towards the right in FIG. 5 after the RTA process. Next, in order to prevent the substrate from being cracked due to rapid cooling after the rapid heating operation, the temperature of the substrate 1 is once dropped to a 580° C. on the preliminary heating plate 307, and is then naturally cooled.

As described above, likewise the process prior to the RTA process, the substrate subjected to the RTA process may be cooled by sequentially conveying to plural plates (308, 309) arranged in an stepwise temperature decreasing order.

Impurity ions contained in the source region 35s and the drain region 35d are activated by annealing the substrate according to the RTA method.

Figure 6E:
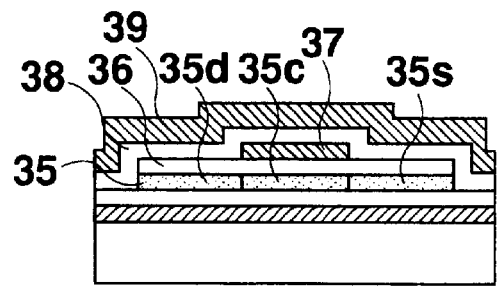
Figure 6F:
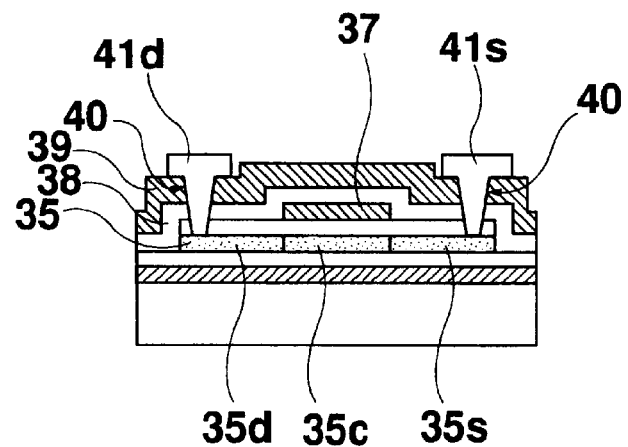

In step 6 (FIG. 6E)

A $SiO_2$ film 38 and a SiN film 39 are next formed on the entire surface of the substrate, including the p-Si film 35, by using the CVD method. Thus, an interlayered insulating film of the $SiO_2$ film 38 and the SiN film 39 is formed. The thickness of the $SiO_2$ film is 500 Å while the thickness of the SiN film 39 is 3000 Å. After formation of the $SiO_2$ film 38 and the SiN film 39, the interlayered insulating film is heated in a nitrogen atmosphere at 400° C. for one hour to introduce hydrogen ions contained in the SiN film 38 into the p-Si film 35. In this process, the crystalline defects in the p-Si film 5 are filled with hydrogen ions (hydrogen atoms).

In step 7 (FIG. 6F):

A first contact hole 40 is formed at the position corresponding to the source region 35s so as to be in contact with the p-Si layer 35 via the interlayered insulating film while a first contact hole 40 is formed at the position corresponding to the drain region 35d so as to be in contact with the p-Si layer 35 via the interlayered insulating film. A source electrode 41s of a metal such as aluminum is formed in the first contact hole 40 while a drain electrode 41d is formed in the first contact hole 40. For example, the source electrode 41s and the drain electrode 41d are formed by patterning an aluminum layer sputtered on the SiN film in which the first contact holes are formed.

In this manner, p-Si TFTs are fabricated.

Next, a liquid crystal display embodying the p-Si TFTs will be described below.

Figure 7:
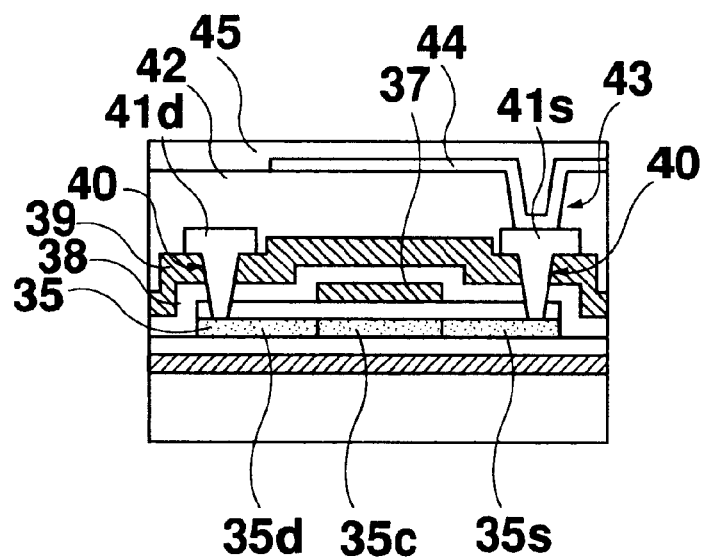
FIG. 7 is a cross sectional view of a semiconductor element in a stage according to the second embodiment of the present invention.

FIG. 7 is a flow diagram illustrating a liquid crystal display manufacturing method.

A liquid crystal display panel can be fabricated by further subjecting the p-Si TFTs produced in the step 7 (FIG. 6F) to the following steps.

In step 8 (FIG. 7):

The entire surface of the intermediate structure is flattened by forming a planar film on the interlayered film and the electrodes in which the source electrode 41s and the drain electrode 41d are formed. The planar film 42 is an acrylic resin film formed by baking an acrylic resin solution coated on the substrate. To obtain the flat surface of the intermediate structure, the acrylic resin film 26 is covered to the uneven surface introduced by the gate electrode 37, the source electrode 41s and the drain electrode 41d.

A second contact hole 43 is formed though the acrylic resin layer, or the planar film, to make contact with the source electrode 41s.

A pixel electrode 44 connected to the source electrode 41s is formed so as to expand over the acrylic resin layer via the second contact hole 43. In order to form the pixel electrode 28, a transparent conductive film, for example, ITO, is first formed on the acrylic resin film in which the second contact hole 43 is formed. Next, a resist film coated on the transparent conductive film is etched in a predetermined electrode pattern. Then the pixel electrode is formed by etching the exposed transparent conductive film according to the dry etching method, for example, RIE method, in which HBr and $Cl_2$ are used as etching gases.

An alignment layer 45 of polyimide or $SiO_2$ is formed over the pixel electrodes and the planar film in the printing method or spinning method.

Figure 8:
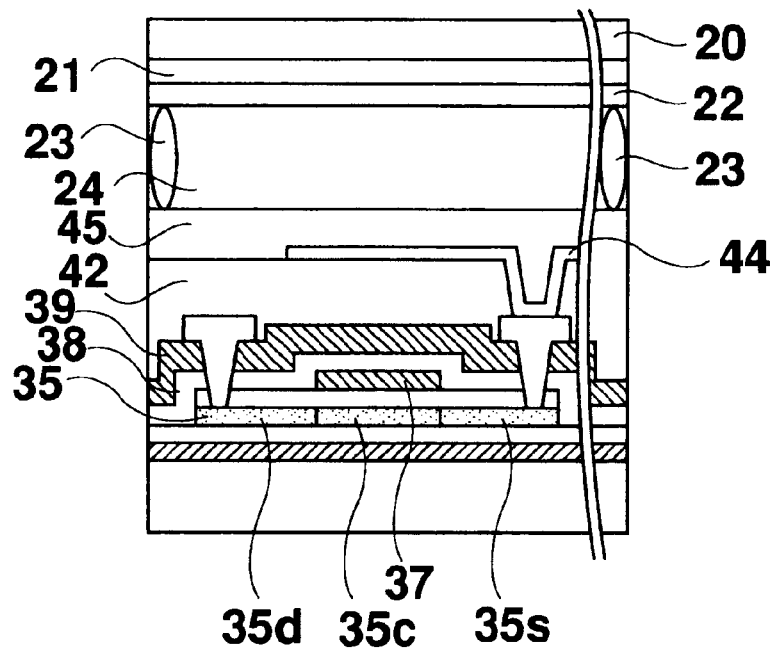
FIG. 8 is a cross sectional view of a semiconductor element in a stage according to the second embodiment of the present invention.

Thus, one TFT substrate for a liquid crystal display is completed. FIG. 8 is a cross sectional view partly illustrating a liquid crystal display which uses the above-manufactured TFT substrate.

As shown in FIG. 8, an opposite electrode 21 of a transparent conductive film such as ITO is formed on the entire surface of the insulating substrate 20 of silica glass or non-alkali glass. In succession, in order to align the liquid crystal, an alignment layer 22 of polyimide or $SiO_2$ is formed on the opposite electrode 47. As a result, an opposite electrode substrate can be obtained.

An opposite electrode substrate is disposed at the position where the TFT substrate confronts. The TFT substrate and the opposite electrode substrate are bonded together, with an adhesive resin seal agent 23 coated on the peripheral portions of them. The gap between the two substrates are filled with a liquid crystal 24 so that a liquid crystal display is completed.

The block configuration of an active matrix LCD employing the first and second embodiments will be described below.

Figure 9:
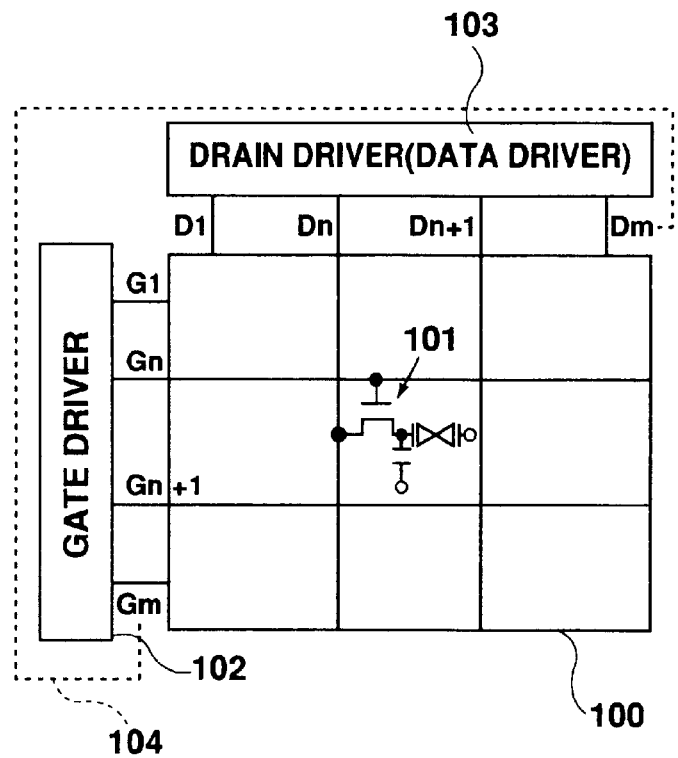
FIG. 9 is a block circuit diagram of a liquid crystal display fabricated through the liquid crystal manufacturing method according to the present invention.

FIG. 9 is a block diagram illustrating the first and second embodiments applied to an active matrix LCD.

Scanning lines (gate lines) G1, . . . , Gn, Gn+1, . . . , Gm and data lines (drain lines) D1, . . . , Dn, Dn+1, . . . , Dm are arranged in the display area 100. The gate lines and the data lines cross each other. A pixel 101 is arranged at the intersection of each gate line and each data line. The gate conductors are connected to the gate driver 102 to receive gate signals (scanning signals). The drain lines are connected to the drain driver (data driver) 103 to receive data signals (video signals). The drivers 102 and 103 configures the peripheral drive circuit 104.

The LCD where at least one of the driver 102 and 103 is formed on the same substrate, together with the display area 100, is generally called a driver-built-in LCD. The gate driver may be disposed on both ends of the display area 100. The drain driver 103 may be disposed on both ends of the display area 100.

P-Si TFTs formed according to the above-described manufacturing method are used as the switching elements in the peripheral drive circuit 104. The p-Si TFTs for the peripheral driver circuit 104 are formed on the same substrate while the above-mentioned p-Si TFTs are being formed. In this example, each of the p-Si TFTs for the peripheral drive circuit has a usual single drain structure rather than an LDD structure, though, of course, the LDD structure may be used.

In the peripheral drive circuit, each driver can be miniaturized by forming p-Si TFTs in a CMOS structure.

Figure 10:
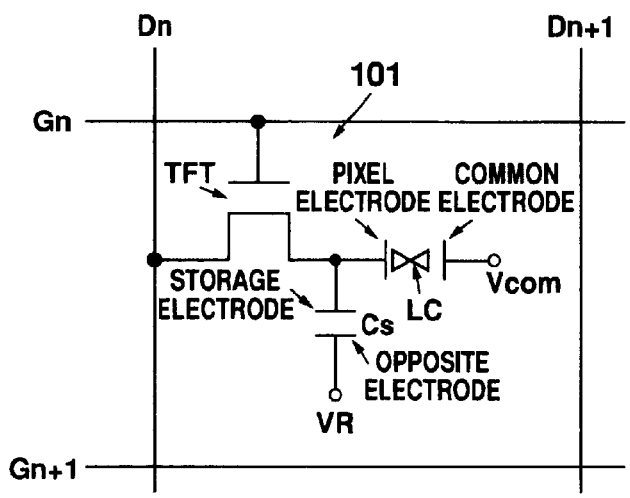
FIG. 10 is an equivalent circuit diagram of a liquid crystal display fabricated through the liquid crystal display manufacturing method according to the present invention.

FIG. 10 is an equivalent circuit of the pixel 101 arranged at the vicinity portion where the gate line Gn and the drain line Dn cross each other.

The pixel 101 comprises a TFT acting as a pixel drive element, a liquid crystal cell LC, and a storage capacitor Cs. The gate of the TFT is connected to the gate line Gn. The TFT drain is connected to the drain line Dn. The source of the TFT is connected to the pixel electrode of a liquid crystal cell LC and the storage capacitor (additional capacitor) Cs.

A signal storage element is formed of the liquid crystal cell LC and the storage capacitor Cs. A voltage Vcom is applied to the common electrode of a liquid crystal cell LC (the electrode on the opposite side the pixel electrode). A constant voltage VR is applied to one electrode of the storage capacitor Cs. The other electrode of the storage capacitor Cs is connected to the source of the TFT. The common electrode of the liquid crystal cell LC is in common connected to all the pixels 101. The other electrode of the storage capacitor Cs opposing the storage electrode may be connected to the neighbor gate conductor Gn+1.

In the pixel 101 thus configured, when a positive voltage is applied to the gate of the TFT via the gate line Gn, the TFT is turned Dn. Then, the static capacitor of the liquid crystal cell LC and the storage capacitor Cs are charged with the data signal applied to the drain line Dn. In contrast, a negative voltage is applied to the gate of the TFT via the gate line Gn, the TFT is turned off, At this time, the voltage applied to the drain conductor Dn is held by means of the static capacitor of the liquid crystal cell LC and the storage capacitor Cs. In this way, an arbitrary data signal can be stored into the pixel by applying a data signal to be written to a pixel to the drain line Dn and then controlling the voltage to the gate line. The transmittance of the liquid crystal cell LC varies according to the data signal held in the pixel so that the pixel is displayed.

Both the writing characteristic and the holding characteristic are important pixel characteristics. For the writing characteristic, it is required that a desired video signal voltage can be sufficiently written to the signal storage elements (a liquid crystal cell LC and a storage capacitor) within a unit time specified by the pixel area specification. For the holding characteristic, it is required that the video signal voltage once written in a signal storage element can be held for only a necessary time.

The storage capacitor Cs is provided to increase the static capacitance of a signal storage element and to improve the writing characteristic and the holding characteristic. The liquid crystal cell LC has a limited static capacitance because of its structural constraints. The storage capacitor Cs can compensate for a shortage of the static capacitance of the liquid crystal cell LC.

What is claimed is:

1. A semiconductor device manufacturing method for manufacturing semiconductor elements on a substrate through a rapid thermal annealing technique using a lamp, comprising the steps of:

sequentially and preliminarily heating said substrate with plural preliminary heating plates arranged for stepwise temperature rise; and then annealing said substrate using the rapid thermal annealing technique.

2. The semiconductor device manufacturing method defined in claim 1, further comprising the step of sequentially cooling said substrate with plural cooling plates arranged so as to perform stepwise temperature decrease after said substrate is annealed through the rapid thermal annealing technique.

3. The semiconductor device manufacturing method defined in claim 1, wherein said step of annealing said substrate with the rapid thermal annealing technique comprises the step of activating impurities doped into a semiconductor film being a part of said semiconductor element.

4. The semiconductor device manufacturing method defined in claim 1, further comprising the step of forming a metal layer on or underneath said semiconductor film before said thermal annealing step; and wherein said step for annealing said substrate through the rapid thermal annealing technique comprises the step of activating impurities doped into a semiconductor film being a part of said semiconductor element.

5. The semiconductor device manufacturing method defined in claim 1, wherein said substrate is a glass substrate.

6. A display device manufacturing method for manufacturing switching elements on a substrate through a rapid thermal annealing technique using a lamp, said switching elements driving pixels, comprising the steps of:

sequentially and preliminarily heating said substrate with plural preliminary heating plates arranged for stepwise temperature rise; and then annealing said substrate using the rapid thermal annealing technique.

7. The display device manufacturing method defined in claim 6, further comprising the step of sequentially cooling said substrate with plural cooling plates arranged so as to perform stepwise temperature decrease after said substrate is annealed through the rapid thermal annealing technique.

8. The display device manufacturing method defined in claim 6, wherein said step of annealing said substrate with the rapid thermal annealing technique comprises the step of activating impurities doped into a semiconductor film being a part of said switching element.

9. The display device manufacturing method defined in claim 6, further comprising the step of forming a metal layer on or underneath said semiconductor film before said thermal annealing step; and wherein said step for annealing the substrate through the rapid thermal annealing technique comprises the step of activating impurities doped into a semiconductor film being a part of said switching element.

10. The liquid crystal display manufacturing method defined in claim 6, wherein said substrate is a glass substrate.

11. A method for manufacturing semiconductor elements on a substrate, comprising the steps of:

preliminarily heating said substrate in a stepwise temperature increase; and preforming heating according to RTA (rapid thermal annealing) technique after said preliminary heating step.

12. The method defined in claim 11, wherein said preliminary heating step is preformed by allowing said substrate to pass through a plurality of heating areas set at different temperatures.

13. The method defined in claim 11, wherein said heating according to RTA method is a processing for activating impurities doped into a semiconductor film constituting a portion of said semiconductor element.

14. The method defined in claim 11, wherein said RTA method is performed by irradiating light using a lamp.

15. The method defined in claim 11, wherein said substrate is made of glass.

16. The method defined in claim 11, wherein said semiconductor element is a thin film transistor.

17. A method for manufacturing semiconductor elements on a substrate, comprising the steps of:

performing heating according to RTA technique; and cooling said substrate in a stepwise temperature drop after the step of heating according to RTA technique.

18. The method defined in claim 17, wherein said cooling step is performed by allowing said substrate to pass through a plurality of cooling areas set at different temperatures.

19. The method defined in claim 17, wherein said heating according to RTA method is a processing for activating impurities doped into a semiconductor film constituting a portion of said semiconductor element.

20. The method defined in claim 17, wherein said RTA method is performed by irradiating light using a lamp.

21. The method defined in claim 17, wherein said substrate is made of glass.

22. The method defined in claim 17, wherein said semiconductor element is a thin film transistor.

23. A method for manufacturing semiconductor elements on a substrate, comprising the steps of:

preliminarily heating said substrate in a stepwise temperature increase;

performing heating according to RTA technique after said preliminary heating step; and cooling said substrate in a stepwise temperature drop after the step of heating according to RTA technique.

24. The method defined in claim 23, wherein said preliminary heating step and said cooling step are performed by allowing said substrate to pass through a plurality of areas set at different temperatures.

25. The method defined in claim 23, wherein said heating according to RTA method is a processing for activating impurities doped into a semiconductor film constituting a portion of said semiconductor element.

26. The method defined in claim 23, wherein said RTA method is performed by irradiating light using a lamp.

27. The method defined in claim 23, wherein said substrate is made of glass.

28. The method defined in claim 23, wherein said semiconductor element is a thin film transistor.

* * * * *